United States Patent
Brown et al.

(10) Patent No.: US 6,815,751 B2
(45) Date of Patent: Nov. 9, 2004

(54) STRUCTURE FOR SCALABLE, LOW-COST POLYSILICON DRAM IN A PLANAR CAPACITOR

(75) Inventors: Jeffrey S. Brown, Middlesex, VT (US); Randy W. Mann, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/064,301

(22) Filed: Jul. 1, 2002

(65) Prior Publication Data

US 2004/0000685 A1 Jan. 1, 2004

(51) Int. Cl.[7] .......................................... H01L 21/8234
(52) U.S. Cl. ....................................... 257/305; 257/301
(58) Field of Search .................................. 257/301–305

(56) References Cited

U.S. PATENT DOCUMENTS

| | | | |
|---|---|---|---|
| 4,577,395 A | | 3/1986 | Shibata |
| 5,183,774 A | * | 2/1993 | Satoh .......................... 438/242 |
| 5,825,073 A | | 10/1998 | Radosevich et al. |
| 6,072,210 A | | 6/2000 | Choi |
| 6,087,214 A | | 7/2000 | Cunningham |
| 6,121,106 A | | 9/2000 | Ellis et al. |
| 6,150,691 A | | 11/2000 | Clampitt |
| 6,177,697 B1 | * | 1/2001 | Cunningham ............... 257/301 |
| 6,251,740 B1 | | 6/2001 | Johnson et al. |
| 6,258,658 B1 | | 7/2001 | Bohm et al. |
| 6,306,720 B1 | | 10/2001 | Ding |
| 6,437,369 B1 | * | 8/2002 | Tang .......................... 257/296 |

* cited by examiner

Primary Examiner—Thanh Nguyen
(74) Attorney, Agent, or Firm—Anthony J. Canale (57) ABSTRACT

Capacitor structures that have increased capacitance without compromising cell area are provided as well as methods for fabricating the same. A first capacitor structure includes insulating material present in holes that are formed in a semiconductor substrate, where the insulating material is thicker on the bottom wall of each capacitor hole as compared to the sidewalls of each hole. In another capacitor structure, deep capacitor holes are provided that have an isolation implant region present beneath each hole.

10 Claims, 10 Drawing Sheets

STRUCTURE FOR SCALABLE, LOW-COST POLYSILICON DRAM IN A PLANAR CAPACITOR

BACKGROUND OF THE INVENTION

1. Field of the Invention

The present invention relates to semiconductor devices, and more particularly to capacitor structures having increased capacitance that can be used as charge storage elements for various memory cells including dynamic random access memory (DRAM) cells. The present invention also relates to methods of fabricating such capacitor structures for use in various memory cells.

2. Background of the Invention

A memory cell in an integrated circuit (IC) includes a transfer device such as a transistor and an associated capacitor. The capacitor, which is typically formed in a portion of a trench, consists of a pair of conductive plates, i.e., electrodes, which are separated from each other by a node dielectric material. Information or data is stored in the memory cell in the form of charge accumulated on the capacitor. As the density of ICs with memory cells is increased, the area for the capacitor becomes smaller and the amount of charge the capacitor is able to accumulate is reduced. Thus, with less charge to detect, reading the information or data from the memory cell becomes much more difficult.

Dynamic random access memory (DRAM) cells are widely used in storing information because they can be implemented to provide an extraordinary number of memory cells in a relatively small area. Although various techniques are known for fabricating DRAM cells, planar DRAM processes have the benefit of low cost and easy integration with standard complementary metal oxide semiconductor (CMOS) processing. The major problem associated with planar capacitors is the inability to scale with technology generations. As cell sizes have decreased, the planar capacitor has not scaled accordingly due to tunneling current constraints. The gate dielectric thickness tends to be 2–3 generations behind. Therefore, to keep the cell capacitance high, the area of the planar capacitor cannot scale with the technology and thus dominates cell area.

One attempt to reduce the cell area, as well as the integration area required for each cell is disclosed, for example, in U.S. Pat. No. 6,087,214 to Cunningham. Specifically, the Cunningham disclosure provides a method for fabricating a memory cell which includes the steps of: selectively removing portions of a substrate using a patterned mask to simultaneously form a capacitor trench and an isolation trench which is at least partially around the capacitor trench; forming an oxide in both the isolation and capacitor trenches; selectively removing the oxide in the capacitor trench; doping portions of substrate so as to define the base and sidewalls of the capacitor; forming a thin capacitor dielectric on the exposed walls (including bottom and sidewalls) of the capacitor trench; and then filling the remaining portion of the capacitor trench with polysilicon.

Despite creating more cell capacitance, the process and structure disclosed in the Cunningham disclosure suffer an area penalty because an isolation trench is needed around the cell to provide cell-to-cell isolation. No method or structure is provided in the Cunningham disclosure that eliminates the isolation trench around the memory cell. As such, the process and structure disclosed in Cunningham fails to provide a capacitor structure for a memory cell having the combination of high cell capacitance and reduced cell area.

In view of the drawbacks mentioned above with prior art processes of fabricating memory cells having the combination of high cell capacitance and reduced cell area, there exists a need for providing a new and improved method for fabricating such memory cells.

BRIEF SUMMARY OF THE INVENTION

One object of the present invention is to provide a capacitor for a memory cell that has increased capacitance.

A further object of the present invention is to provide a high-capacitance capacitor for a memory cell array that maintains cell-to-cell isolation without the need of requiring isolation trench regions to surround each memory cell.

A yet further object of the present invention is to provide a high-capacitance capacitor for a memory cell that is fabricated using existing CMOS processing techniques.

An even further object of the present invention is to provide a high-capacitance capacitor for a memory cell that can be fabricated into either a bulk semiconductor substrate or a layered semiconductor substrate such as, for example, a silicon-on-insulator (SOI) substrate.

These and other objects and advantages are achieved in a first embodiment of the present invention by providing a capacitor design that uses standard CMOS processing plus one extra mask to partially recess isolation material from a plurality of isolation-filled trenches that are formed in a semiconductor substrate so as expose sidewalls of each of the holes. The amount of sidewall exposure can be modulated by the recess, such that more isolation material can be removed from the holes to further increase capacitance as technologies scale. To maximize the sidewall capacitance improvement, the inventive layout of the capacitor changes from a single square capacitor design (such as described in the Cunningham disclosure mentioned supra) to a multi-fingered capacitor.

In a second embodiment of the invention, the isolation-filled trenches are etched to remove all of the isolation fill in areas where the capacitors are to be formed. A subsequent etch is carried out to increase the depth of the trenches in these areas, and the bottoms of the etched trenches are implanted with dopant ions to provide isolation.

In a third embodiment of the invention, the isolation-filled trenches in an SOI substrate are etched to remove all the isolation fill in areas where the capacitors are to be formed. The etch is continued into the buried SOI oxide itself for enough time to provide sufficient depth for a capacitor while still leaving enough buried SOI oxide to provide isolation.

Accordingly, a first aspect of the present invention relates to a capacitor structure which is formed in a semiconductor substrate, e.g., bulk or layered, which comprises: a plurality of holes, each having a plurality of sidewalls and a bottom wall, located in a region of a semiconductor substrate in which a plurality of isolation filled trenches are absent, said holes having a depth proximate that of said plurality of isolation filled trenches; insulating material present in each hole on said plurality of sidewalls and bottom wall, wherein said insulating material is thicker on said bottom wall as compared to said plurality of sidewalls; and a conductor filling each of said holes.

In a second aspect, the present invention relates to a memory cell structure which includes at least the aforementioned first capacitor structure. Specifically, the inventive memory cell structure comprises: a transfer device located atop a surface of a semiconductor substrate; and a capacitor having an electrode coupled to said transfer device, said capacitor comprising: a plurality of holes, each having a plurality of sidewalls and a bottom wall, located in a region of a semiconductor substrate in which a plurality of isolation filled trenches are absent, said holes having a depth proximate that of said plurality of isolation filled trenches and are arranged to form a plurality of laterally extending portions having a plurality of sides and a bottom, insulating material present in each hole on said plurality of sidewalls and bottom wall, wherein said insulating material is thicker on said bottom wall as compared to said plurality of sidewalls, counter-dopant regions on the sides of said laterally extending portions, and a conductor filling each of said holes.

In a third aspect, the present invention relates to a capacitor structure having increased capacitance. The second capacitor structure of the present invention comprises: a plurality of holes, each having a plurality of sidewalls and a bottom wall, located in a region of a semiconductor substrate in which a plurality of isolation filled trenches are absent, said holes having a depth that is deeper than that of said plurality of isolation filled trenches; an insulation implant region beneath each of said holes; insulating material present in each hole on said plurality of sidewalls and bottom wall; and a conductor filling each of said holes.

DETAILED DESCRIPTION OF THE INVENTION

The present invention, which provides capacitor structures having increased capacitance for use in various memory cells and methods for fabricating the same, will now be described in greater detail by referring to the drawings that accompany the present application.

The present invention provides two types of capacitor structures that have increased capacitance associated therewith. The first capacitor structure having increased capacitance is illustrated in FIG. 1H, while the second capacitor structure having increased capacitance is illustrated in FIG. 3G. The first capacitor structure includes holes that have more insulating material present on the bottom wall, then on the vertical sidewalls. The second capacitor structure includes holes that are deeper than the corresponding trench isolation regions that include an isolation implant region beneath each hole for device-to-device isolation.

Figure 1A:
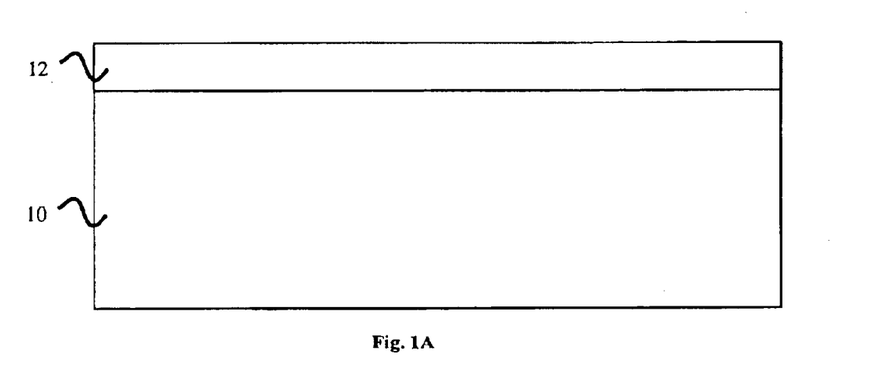
FIGS. 1A–1H show the basic processing steps employed in fabricating one of the capacitor structures of the present invention.

In regard to the first capacitor structure, reference is first made to FIG. 1A which illustrates an initial structure that is employed in the present invention. Specifically, the initial structure shown in FIG. 1A comprises semiconductor substrate 10, and a pad layer 12 formed on a surface of semiconductor substrate 10. It is noted that the initial structure shown in FIG. 1A is formed at least in regions of substrate 10 where capacitor devices are to be formed. The other regions of the substrate which include trench isolation regions, as well as the transfer device for the memory cell are not shown in this drawing, for the purpose of clarity, are meant to be adjacent to the region depicted herein.

The structure shown in FIG. 1A is comprised of conventional materials well know in the art and it is fabricated utilizing processing steps that are also well known in the art. For example, semiconductor substrate 10 comprises any semiconducting material including, but not limited to: Si, Ge, SiGe, GaAs, InAs, InP and all other III/V semiconductor compounds. Semiconductor substrate 10 may also include a layered substrate comprising the same or different semiconducting material, e.g., Si/Si or Si/SiGe. The substrate may be of the n- or p-type depending on the desired device to be fabricated. In one highly preferred embodiment of the present invention, semiconductor substrate 10 is comprised of Si.

Pad layer 12 may be comprised of an oxide, nitride, oxynitride or any combination thereof including multi-layers. A preferred pad layer employed in the present invention is a multi-layered structure which comprises a nitride present atop an oxide. The thickness of pad layer 12 may vary depending on the material of the pad layer as well as the method used in forming the same. Typically, pad layer 12 has a total thickness of from about 1000 Angstroms to about 1500 Angstroms When pad layer 12 is comprised of an oxide/nitride stack, the oxide portion of the pad layer which is formed atop the semiconductor substrate is generally thinner than the nitride portion of the pad layer.

After forming pad layer 12 atop semiconductor substrate 10, patterned photoresist 14 (See, FIG. 1B) is formed atop the upper surface using conventional techniques well known in the art including deposition and lithography. The lithographic step employed in the present invention includes exposing the applied photoresist to radiation through a mask and developing the pattern into the photoresist using a conventional resist developer.

The pattern is then transferred to the initial structure shown in FIG. 1A using one or more etching steps that are capable of opening a plurality of holes 16 into pad layer 12 and semiconductor substrate 10. Note that during this step of the present invention corresponding trenches used in forming trench isolation regions (not shown) are being simultaneously formed into the substrate. Each hole has a plurality of sidewalls 18 and a common bottom wall 20. The number of holes formed in the substrate is not limited to any specific number provided that at least one capacitor hole be formed. Note that the holes form finger regions of the capacitor, which are separated from each other by pillar regions of semiconductor substrate that are not subjected to etching.

Figure 1B:
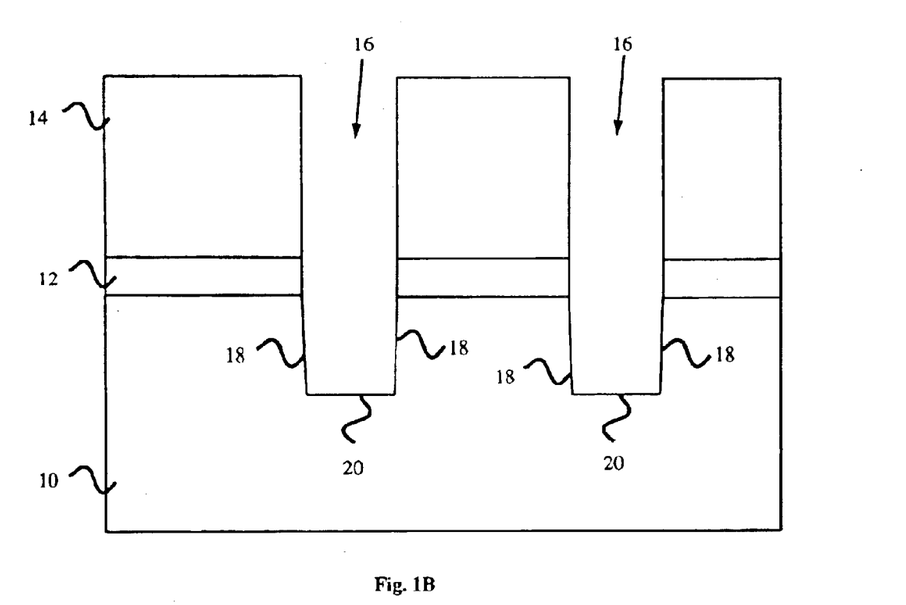
Figure 1C:
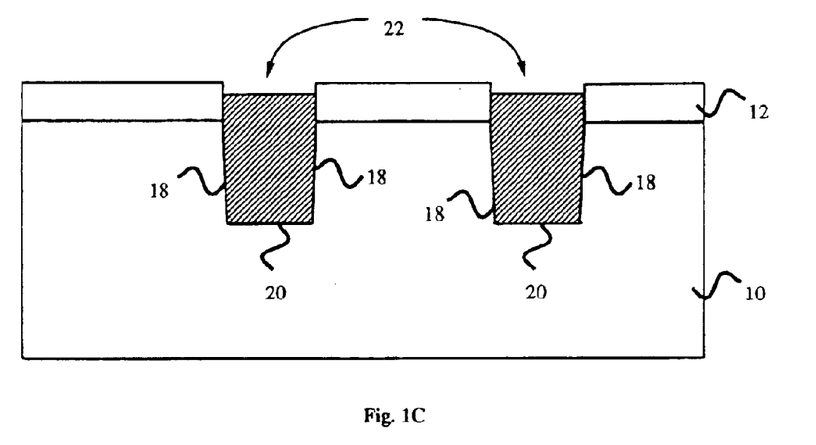
Figure 1D:
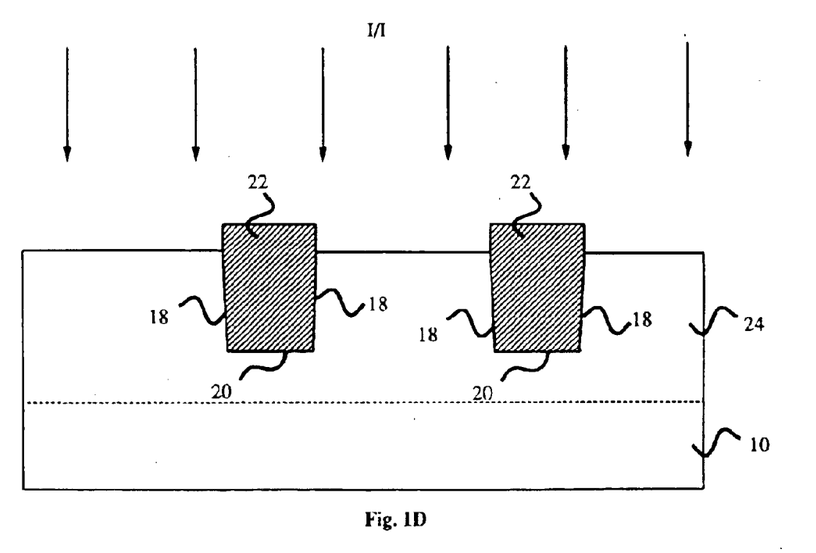

Suitable etching processes that may be employed at this point of the inventive process include, but are not limited to: reactive-ion etching, ion beam etching, plasma etching, laser ablation or any combination thereof. The depth of the holes, as measured from the upper surface of substrate 10, is not critical to the present invention. However, since this step of the present invention is also used in forming the trenches for the isolation trench regions (not shown), the depth of the holes formed is proximate that of the trenches used in forming the isolation regions, about 0.5 microns in a 0.13µ CMOS technology (as technology continue to shrink so will the depth of trench isolation structures). The resultant structure that is formed after the above processing steps have been performed is shown in FIG. 1B.

In embodiments where pad layer 12 includes an upper most nitride layer, the upper nitride layer is now removed using an etching process that is highly selective in removing nitride as compared to oxide. Well implants 24 (see FIG. 1D) are then formed into portions of the semiconductor substrate using an ion implantation process well known to those skilled in the art that is capable of implanting P- or N-type dopants into substrate 10.

Figure 1E:
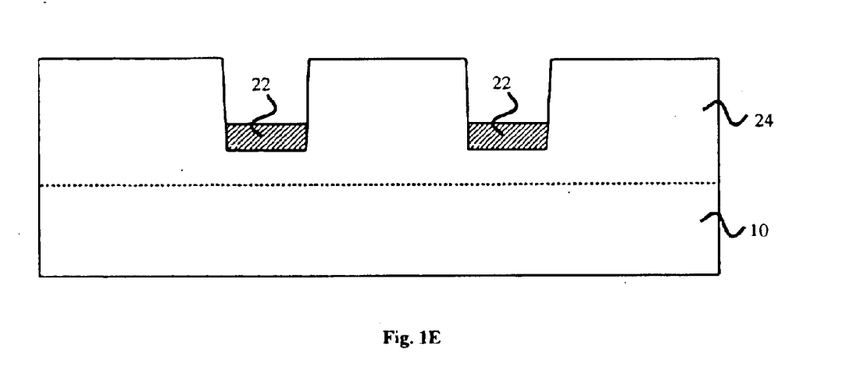

Next, and as shown in FIG. 1E, insulating material 22 is recessed below the upper most surface of semiconductor substrate 10 using a timed etching process that is selective for removing oxide from the structure. Note that, if the pad layer 12 includes an oxide, this etching step removes the pad oxide layer from the structure as well. It is noted that a mask (not shown) is formed over the structure where the trench isolation regions and the transfer device regions are located so as to protect those regions from this step as well as the implant step shown in FIG. 1F.

This recessing step exposes portions of the sidewalls 18 of each hole, while maintaining a portion of insulating material 22 atop the common bottom wall 20. The amount of insulating material remaining in the hole may vary depending on the overall time of the etching process. Typically, from about 500 to about 1500 Angstroms of insulating material 22 remains in the holes after this etching step. The amount of insulating material remaining in each hole after this step of the present invention should be sufficient to provide adequate cell-to-cell isolation. The amount of sidewall exposure can be modulated by this step of the present invention to increase the capacitance as technologies scale.

Figure 1F:
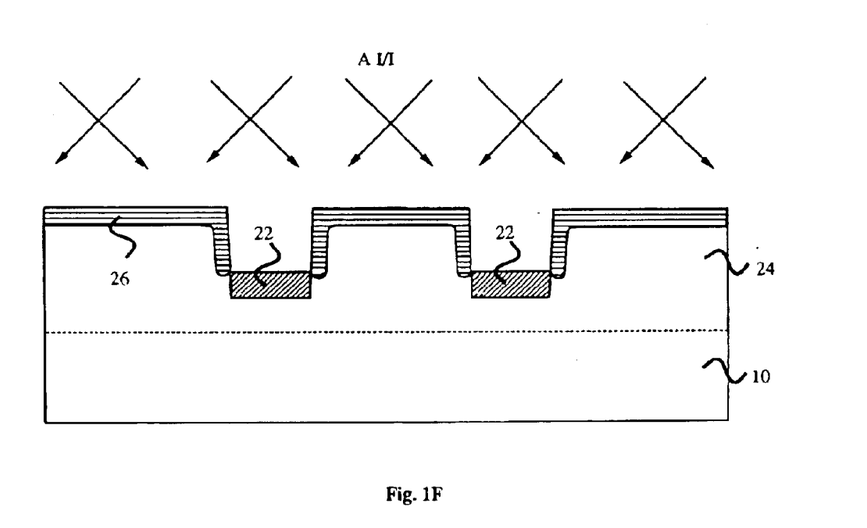

Next, as shown in FIG. 1F, counter-dopant regions 26 are formed into substrate 10 adjoining the exposed sidewalls by first using an angled ion implant AI/I well known to those skilled in the art. The angled implant is employed to ensure that the thickness of the resulting diffusion region is substantially constant on the top of the substrate and on the exposed portions of sidewalls 18. The counter-dopant regions formed at this point of the present invention typically are of an opposite dopant type than the well regions previously formed into substrate 10. Formation of the counter-dopant regions 2C is then completed using a conventional activation annealing process well known to those skilled in the art. The counter-dopant regions 26 are formed in the pillar regions of substrate 10 that are adjacent to each of the holes. The counter-dopant regions serve as one of the electrodes of the inventive capacitor; the other electrode is comprised of conductor 30 which is described in more detail hereinbelow.

The mask protecting the isolation trench regions and the area where the transfer device will be subsequently formed is then removed from the structure utilizing any conventional stripping process well known to those skilled in the art. Following the stripping of the mask, the structure may optionally be subjected to a gate precleaning step prior to forming thin insulating layer 28 on exposed portions of semiconductor substrate 10. An example of an optional gate precleaning step that can be employed in the present invention is dilute hydrofluoric acid or buffered hydrofluoric acid.

Figure 1G:
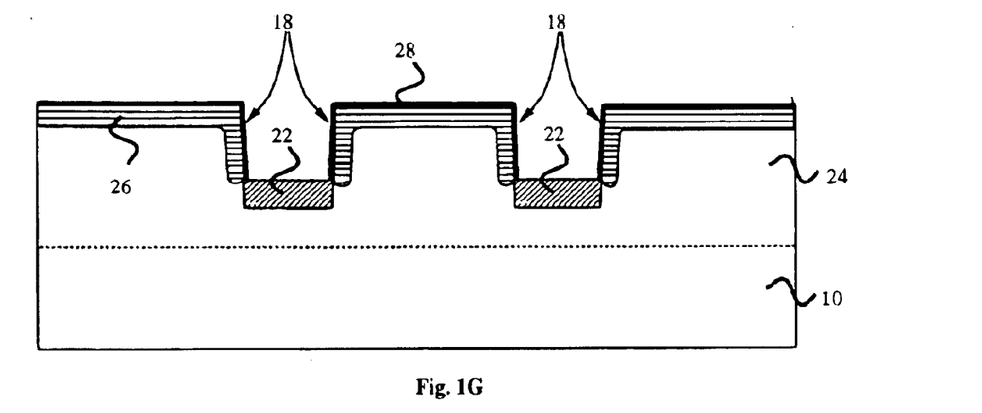
Figure 1H:
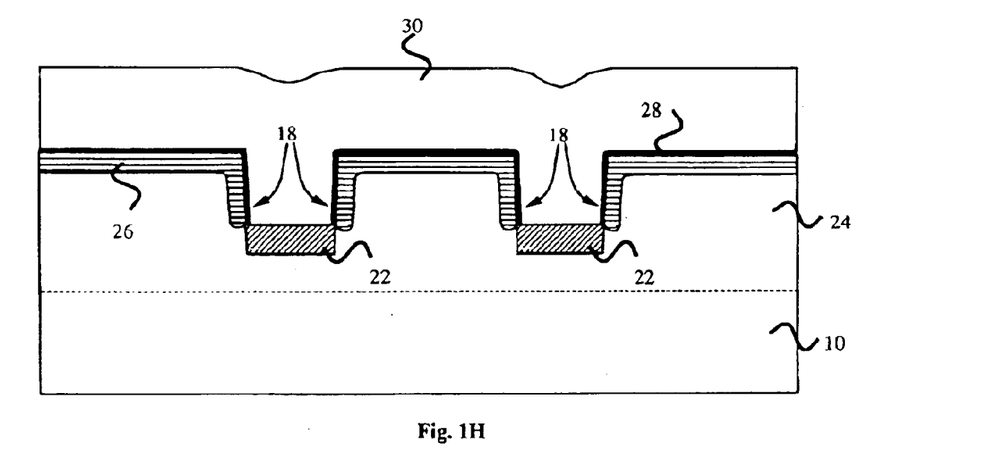

Thin insulating layer 28 is then formed on the structure utilizing a conventional thermal growing process well known to those skilled in the art. Although the present invention contemplates nitride and oxynitrides as the material for thin insulating layer 28, it is preferred that thin insulator layer 28 be composed of an oxide such as $SiO_2$. The thin insulating layer thus may be composed of the same material as insulating material 22 or thin insulating layer 28 may be composed of a different insulating material as insulating material 22. Note that thin insulator layer 28 lines at least the exposed sidewalls of each hole as well as other bare substrate surfaces. This thin insulating layer can be used in the transfer device regions as the gate dielectric of a field effect transistor (FET). The resultant structure including the thin insulating layer is shown, for example, in FIG. 1G.

The thickness of thin insulating layer 28 may vary, but typically thin insulating layer 28 has a thickness of from about 2.0 to about 6.0 nm, with a thickness of from about 2.5 to about 3.0 nm being more highly preferred. It is noted that in this embodiment of the present invention thin insulating layer 28 as well as insulating material 22 form the node dielectric of the inventive capacitor which isolates counter-dopant regions 26 from conductor 30. In the second capacitor structure, to be described in more detail hereinbelow, thin insulating layer 28 is the only capacitor node dielectric since insulating material 22 is completely removed from the capacitor holes.

Conductor 30 is then formed atop the thin insulating layer using a deposition process such as CVD, plasma-assisted CVD, evaporation, plating, and chemical solution deposition. Conductor 30 may comprise any conductive material including, but not limited to: conductive elemental metals, alloys that include at least one conductive elemental metal, conductive metal silicides or nitrides, as well as polysilicon. When polysilicon is employed as conductor 30, the polysilicon may be formed using an in-situ doping deposition process, or alternatively, the polysilicon may be formed by deposition and ion implantation.

Following the deposition of conductor 30, the conductor is then selectively removed from predetermined portions of the structure using lithography and etching. The lithographic step includes applying a photoresist (not shown), exposing the applied resist to a pattern of radiation and developing the pattern into the resist so as to expose portions of the conductor. The exposed portions of conductor 30 are removed via an etching process such as reactive-ion etching that selectively removes conductor material from the structure, and thereafter the patterned resist is removed so as to provide the structure shown in FIG. 1H. It is noted that portions of conductor 30 may also be used as the gate conductor of the adjacent transfer device.

The capacitor structure shown in FIG. 1H includes finger-like capacitor regions that are separated from each other by vertical semiconductor pillars. Although each finger-like region is separated from each other, each finger is coupled together by the counter-dopant regions that are present in the pillar portions of substrate 10 as well as the common conductor 30.

Figure 2:
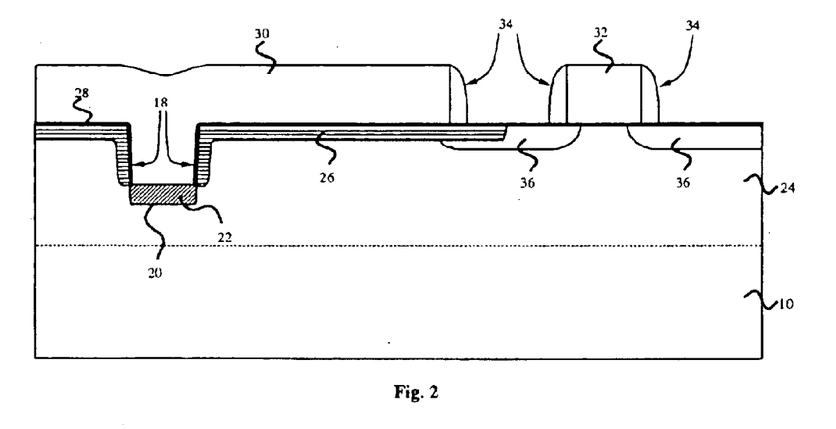
FIG. 2 is a pictorial representation (cross-sectional view) showing the inventive capacitor structure of FIG. 1H employed as a storage element of a DRAM cell.

Conventional CMOS processing may then be performed on the capacitor structure illustrated in FIG. 1H providing the memory cell structure shown, for example, in FIG. 2. Note that the memory cell structure of FIG. 2 includes the inventive capacitor as well as adjacent FET 32. The adjacent FET includes insulating layer 28, gate conductor 30, sidewall spacers 34, and source/drain diffusion regions 36. Coupling of the FET and the capacitor is achieved in the present invention by one of the counter-dopant regions of the capacitor and one of the diffusion regions of the FET.

The present invention also provides a second capacitor structure that has improved capacitance. The second structure of the present invention differs from the first structure in that it does not require that the insulating material within the capacitor holes have a thickness on the bottom wall that is thicker than the insulating material present on the sidewalls. Instead, improved capacitance is achieved by providing capacitor holes that are deeper than the previous capacitor holes used in the first embodiment and thereafter forming an isolation implant region beneath each of the deeper holes.

The initial processing of this second embodiment of the present invention is the same as that of the first embodiment as shown in FIGS. 1A, 1B, and 1C. A mask (not shown) is then formed on areas of the structure in which trench isolation regions are to be present (the capacitor holes are left exposed), and then the insulating material with the exposed capacitor holes is completely etched using an etching process that is highly selective in removing insulating material 22. A second etching step that is selective to the substrate material is then performed so as to deepen the capacitor holes. The structure including deeper capacitor holes 17 is shown, for example, in FIG. 3A.

Figure 3A:
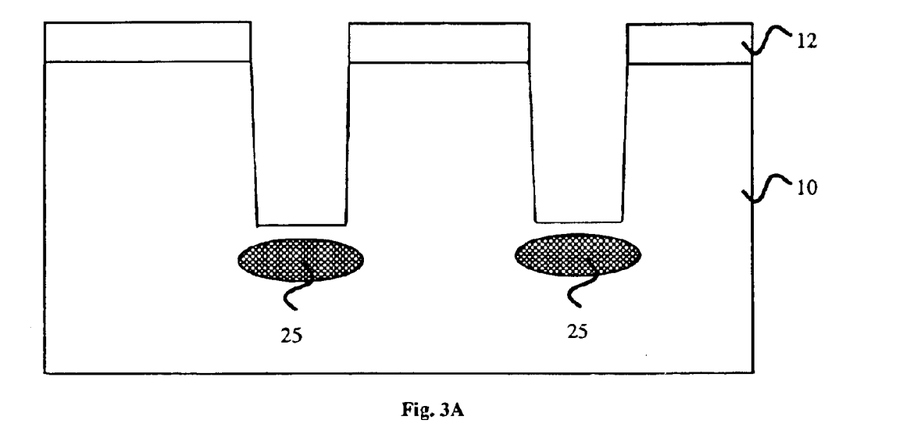
FIGS. 3A–3D show the basic processing steps employed in fabricating an alternative capacitor structure of the present invention.

Isolation implant regions 25 are then formed beneath the deepened holes, using any ion implantation process that is capable of implanting dopant ions into the substrate that is located at a depth below the initial substrate surface, not protected by the pad layer 12. Following the implant process, an annealing step may be performed to activate the isolation implant regions. The conditions used to implant and activate the optional isolation implant regions are well known to those skilled in the art. If the upper layer of pad layer 12 is composed of nitride, the nitride is now stripped from the structure using a conventional etching process that selectively removes nitride.

Figure 3B:
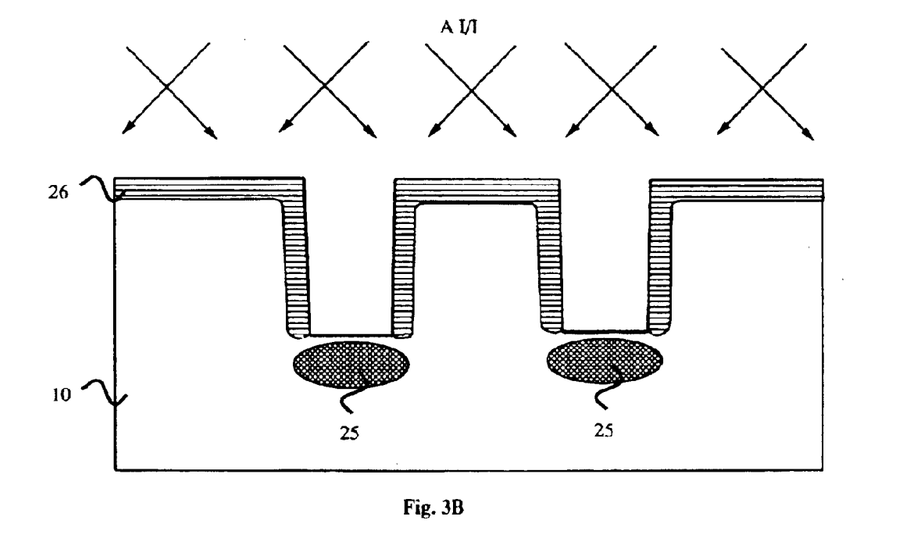
Figure 3C:
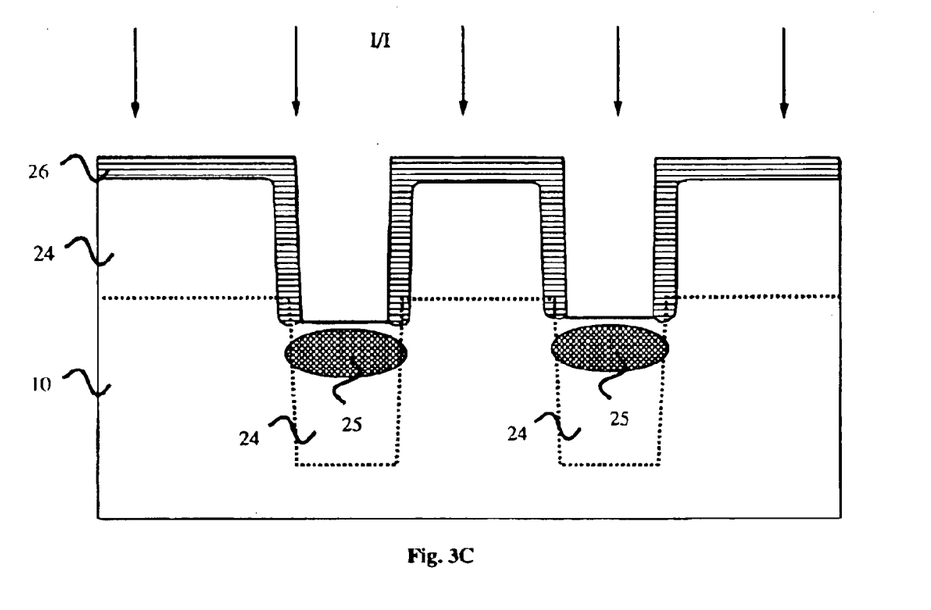

Then, as shown in FIG. 3B, counter-dopant regions 26 are formed in the pillar regions of substrate 10 that surround each deepened hole using the same process as described previously and then as shown in FIG. 3C the well implants 24 are formed.

Figure 3D:
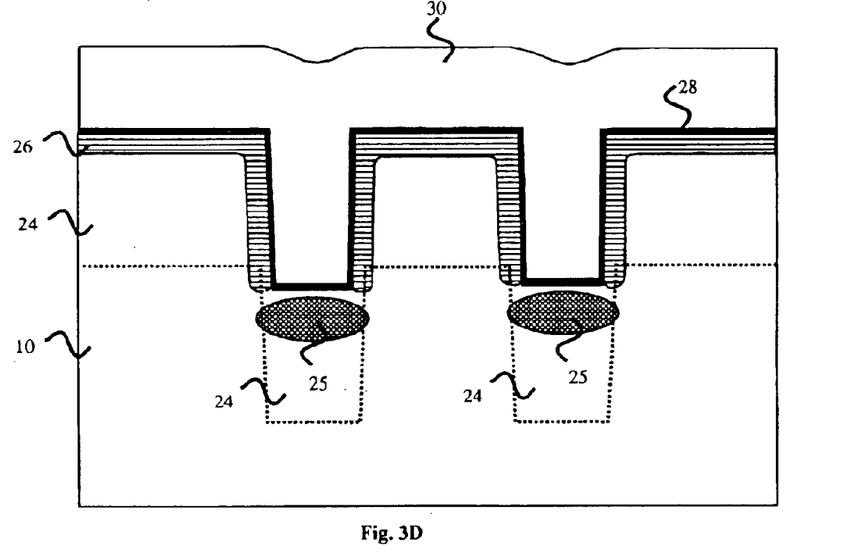

The remaining processes are described in the first embodiment. The final capacitor structure is shown in FIG. 3D. Further CMOS processing carried out to form a transfer device such as an FET coupled to this capacitor.

Figure 4:
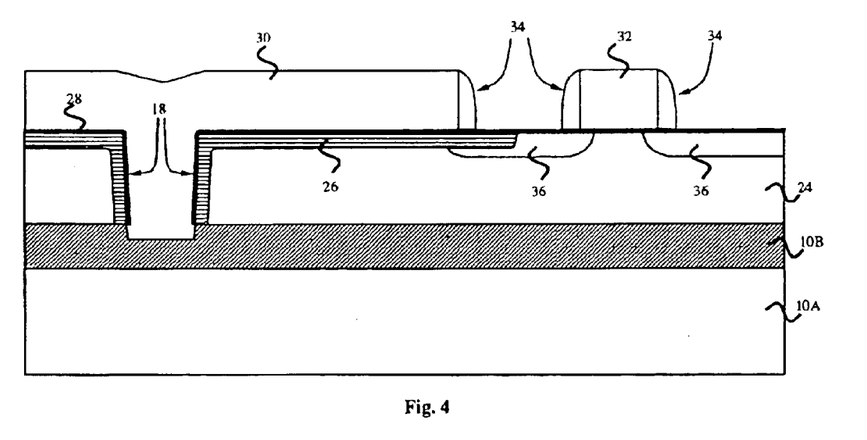
FIG. 4 is a pictorial representation (cross-sectional view) showing the inventive capacitor structure for the SOI embodiment.

A third embodiment of the present invention is shown in FIG. 4. In this embodiment, the capacitor of the invention is formed in a SOI structure which includes a bottom Si-containing substrate layer 10A, an insulating region (such as a buried oxide) present atop the bottom Si-containing substrate layer 10B, and a top Si-containing layer present on the insulating region IOC. Note that when an SOI structure is employed as substrate 10, the inventive capacitor is formed substantially within the top Si-containing layer. Note also that while the isolating trench (not shown) extends to the upper surface of the isolation layer 10B, the trench in which the capacitor is to be formed is over-etched to extend into isolation layer 10B such that it provides sufficient capacitance while leaving enough buried SOI isolation to provide isolation form the underlaying silicon 10A. This embodiment is formed using the same steps shown and described with reference to FIGS. 3A–3D.

Figure 5:
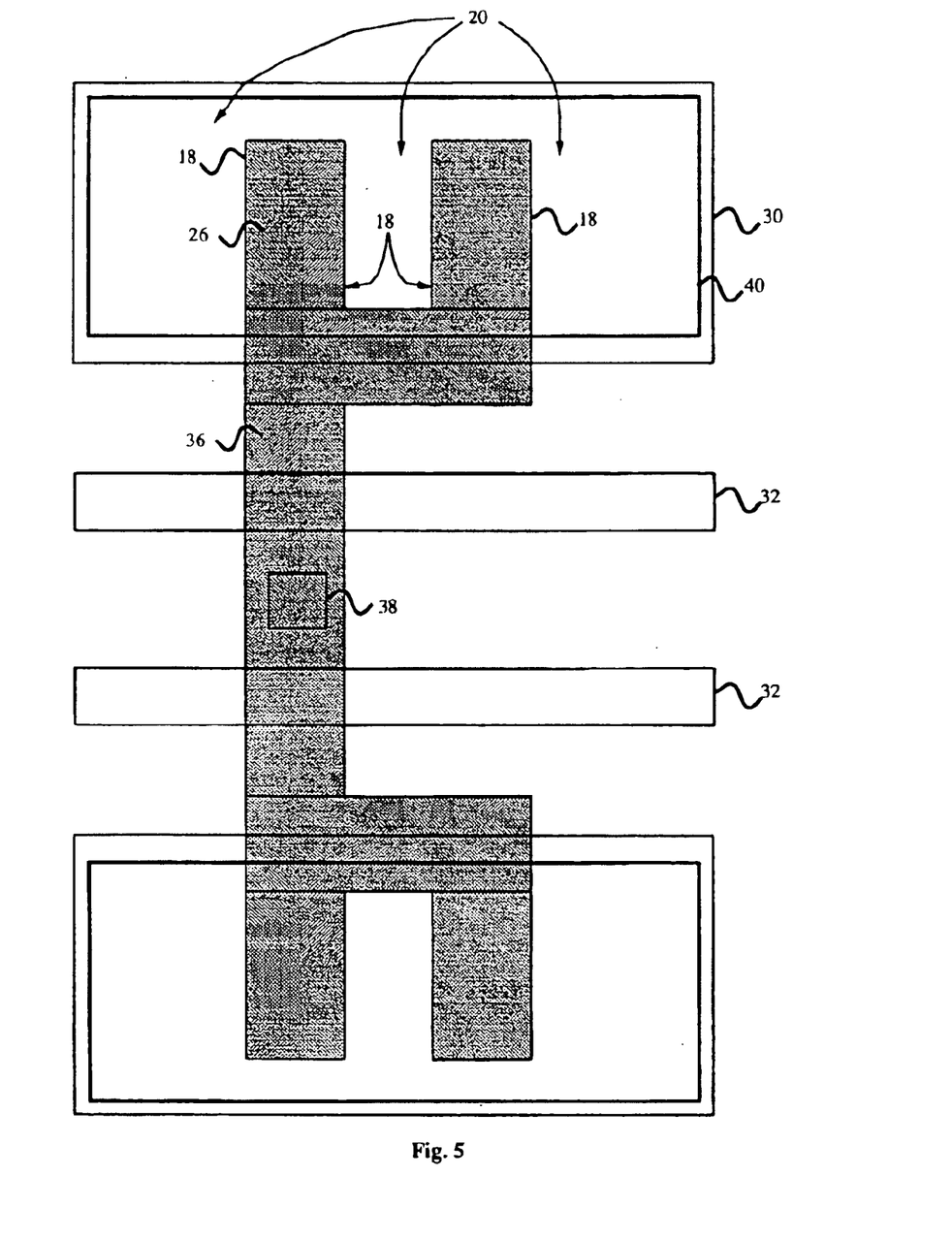
FIG. 5 is the top view (layout of a planar DRAM cell showing the fingered design and the new mask to define the inventive capacitor structure.

FIG. 5 illustrates a top view of the capacitors of the invention. Note that as a practical matter the conductor 30 and the gate electrode 32 would cover the conductor filled trenches, but the implant 26 as well as the trench sidewalls 18 and bottom 20 are shown for clarity. The fingered arrangement increases capacitance by increasing the total unit area of the capacitor without decreasing the DRAM cell density on the chip. Mask 40 defines regions where oxide is recessed as shown in FIGS. 1E and 3A. The bit line contact 38 is shared between adjacent cells.

While the present invention has been particularly shown and described with respect to preferred embodiments thereof, it will be understood by those skilled in the art that the foregoing and other changes in form and details may be made without departing from the spirit and scope of the present invention. It is therefore intended that the present invention not be limited to the details described and illustrated, but fall within the scope of the appended claims.

What is claimed is:

1. A structure formed on a semiconductor, substrate comprising:

a plurality of isolation filled trenches in a first region of the substrate;

at least two adjacent memory cells comprising a plurality of holes in the substrate, each of said holes having a plurality of sidewalls and a bottom wall, said adjacent memory cells located in a second region of the semiconductor substrate in which said plurality of isolation filled trenches are absent, said holes having a depth proximate that of said plurality of isolation filled trenches;

insulating material present in each of said plurality of holes on said plurality of sidewalls and bottom wall; and a conductor overfilling each of said holes and extending onto an adjacent upper surface of the substrate;

wherein said adjacent memory cells are electrically isolated by said plurality of holes.

2. The structure of claim 1 further comprising counter-doped regions present in pillar areas of said semiconductor substrate that surround said holes.

3. The structure of claim 1 further comprising well implants regions located in said semiconductor substrate.

4. The structure of claim 1 further comprising at least one transfer device located atop a surface of said semiconductor substrate adjoining said plurality of holes.

5. The structure of claim 4 wherein said at least one transfer device is a field effect transistor.

6. The structure of claim 2, wherein said insulating material is thicker on said bottom walls of said plurality of holes than on said plurality of sidewalls of said plurality of holes.

7. The structure of claim 6, wherein said insulating material is disposed on said upper surface of the substrate beneath portions of said conductor thereon.

8. The structure of claim 1, wherein said holes have a depth greater than said plurality of isolation-filled trenches.

9. The structure of claim 8, wherein an isolation dopant region is disposed below said bottom walls of said plurality of holes.

10. The structure of claim 1, wherein the substrate has a buried insulation region, and wherein said plurality of holes extend into said buried insulation region.

* * * * *